United States Patent [19]

Paddison, deceased et al.

[11] 4,301,408
[45] Nov. 17, 1981

[54] ELECTRICAL MEASURING APPARATUS EMPLOYING MAGNETO-ELECTRIC DEVICES

[75] Inventors: Eric Paddison, deceased, late of Stafford, England, by Ethel Paddison, administratrix; Roger G. Fordham, Stafford; Alan J. Thomas, Skipton, both of England

[73] Assignee: The General Electric Company Limited, London, England

[21] Appl. No.: 37,415

[22] Filed: May 9, 1979

[30] Foreign Application Priority Data

May 15, 1978 [GB] United Kingdom ............... 19656/78

[51] Int. Cl.³ ...................... G01R 21/06; G01R 33/00
[52] U.S. Cl. ................................ 324/141; 324/117 R; 324/130; 324/142; 324/252
[58] Field of Search ........... 324/141, 142, 252, 117 R, 324/117H, 130; 364/846; 340/347 CC

[56] References Cited

U.S. PATENT DOCUMENTS 3,094,875  6/1963  Fluegel ............................... 324/120
3,824,588  7/1974  Vermillion ........................ 324/130

OTHER PUBLICATIONS

Gilbert, B.; "Novel Magnetic-Field Sensor . . . "; Electronic Letters; Nov. 11, 1976; vol. 12; No. 23; pp. 608-610.
Manley et al., "Novel Magnetic-Field Sensor . . . "; Electronic Letters; Nov. 11, 1976; vol. 12; No. 23; pp. 610-611.
"Digital Output Produced . . . "; Electronic Design; Apr. 12, 1977; vol. 25, No. 8; p. 150.
Kinberg et al., "Calibrated Analog-to-Digital . . . "; IBM Tech. Dis. Bull.; vol. 9; No. 11; Apr. 1967; pp. 1537-1538.
Gilbert B.; "A New Technique . . . "; IEEE J. of Solid-State Circuits; vol. SC-10; No. 6; Dec. 1975; pp. 437-447.

*Primary Examiner*—Ernest F. Karlsen
*Attorney, Agent, or Firm*—Kirschstein, Kirschstein, Ottinger & Cobrin

[57] ABSTRACT

An electrical measuring apparatus comprising a current domain magnetometer (C.D.M.) (1) and summation means (2) for summing the output pulses from the C.D.M., the sum of the summation means representing the integral of a predetermined function of the voltage and magnetic flux applied to the C.D.M. with respect to time. The predetermined function may be proportional to the product of the voltage and magnetic flux and the apparatus may produce measurements of voltage, magnetic flux, power or phase angle.

4 Claims, 1 Drawing Figure

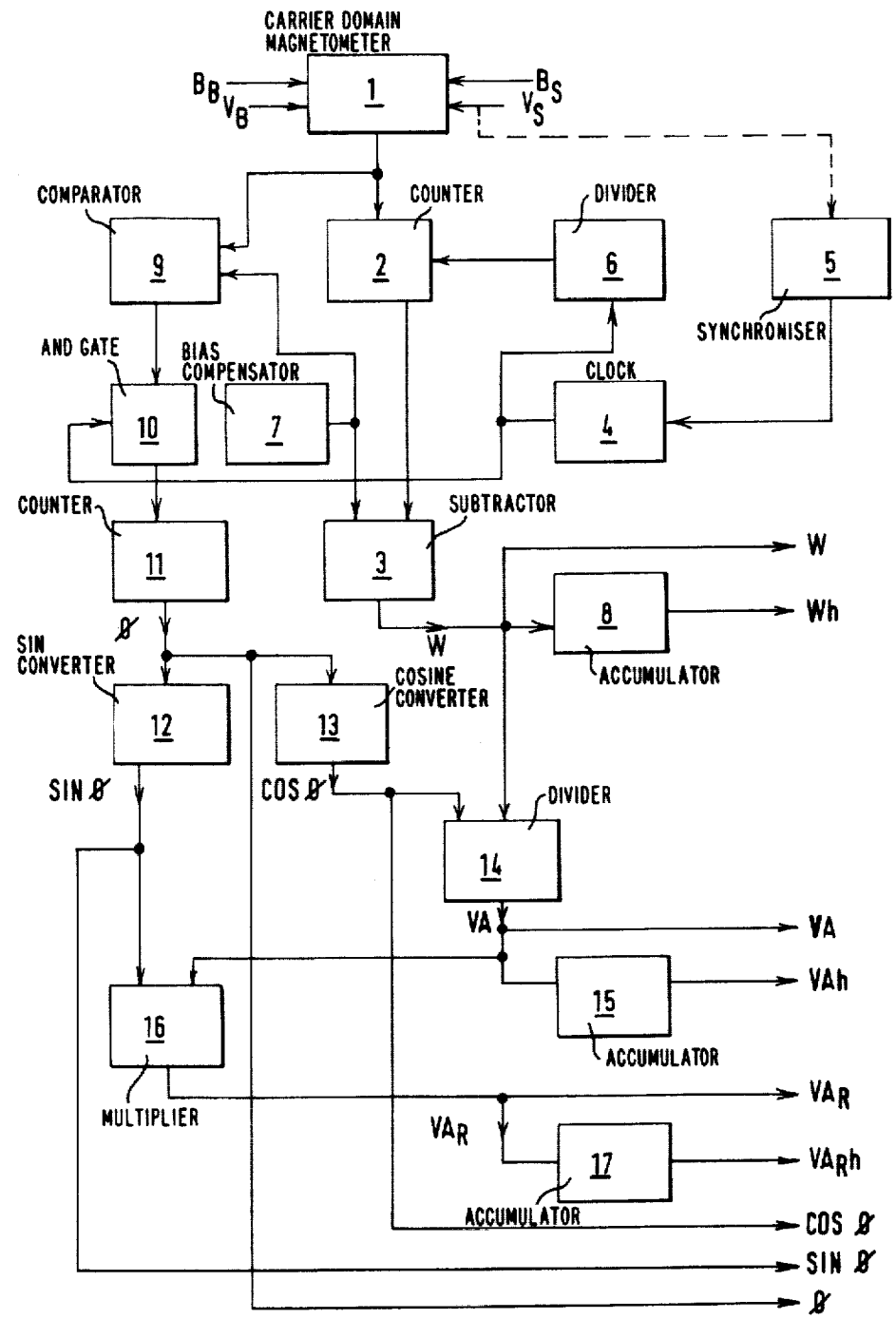

ELECTRICAL MEASURING APPARATUS EMPLOYING MAGNETO-ELECTRIC DEVICES

This invention relates to electrical measuring apparatus.

The invention described herein employs a semi-conductor device in which a current carrying part (the domain) is caused to rotate by the application of a magnetic field at a rate dependent upon the magnetic flux density and an applied voltage, thereby to produce an output whose frequency is representative of the magnetic flux density and the applied voltage. The generic name used for such a structure hereinafter is a Carrier Domain Magnetometer (C.D.M.), but it has also been referred to in published work as a Carrier Domain Device (C.D.D.) (Cf.Gilbert, B. Electronics Letters, 1976, 12, pp 608-610, and Manley, M. H. et al. Electronics Letters, 1976, 12, pp 610-611).

A C.D.M. may be fabricated by a conventional bipolar process and can be integrated on-chip with ancillary circuits. In a particular example it consists of an extended bipolar structure designed so that only a small part of it (the "domain") is conducting at any given time. The domain forms spontaneously by virtue of positive feedback between a circular npn and a circular pnp transistor. The domain position is sensed by several contacts located around the collector region of one transistor. A magnetic field applied normally to the device causes Lorentz forces to act on the carriers flowing in each transistor. The effect of this magnetic interaction is that a circumferential shift is inserted into the feedback loop enclosing the two transistors, causing the domain to rotate continuously around the device. The sense of rotation corresponds to the field polarity and the frequency of rotation is proportional to the magnitude of the normal magnetic flux density and an applied voltage. In currently available devices there exists a lower threshold limit of magnetic field below which the domain "sticks" at some inhomogeneity within the device. It is also probable that an upper limit exists, possibly related to the transition frequency $f_T$ of the slowest transistor, but experience of such a limit has not yet been reported.

It can be shown both analytically and experimentally that the output frequency of a C.D.M. is a function of several input variables, i.e.

$f = g(V, I, B, \theta)$ where:

f = Output frequency;
g = A function;
V = Applied voltage (there could be more than one such input);
I = Applied current (there could be more than one such input);
B = Applied Magnetic flux density normal to the carrier domain plane; and
$\theta$ = Device temperature.

However for practical purposes, over an appreciable range in f the relationship $f = h (V, B)$ exists to within acceptable limits of accuracy, h being a known function which under suitable operating conditions may be proportional to the product of V and B.

The present invention lies in the appreciation by the inventors that a C.D.M. has especial application in the field of electrical measurement especially where the measurement required involves the multiplication of two input variables.

According to the invention an electrical measuring apparatus comprises a current domain magnetometer (C.D.M.); and summation means for summing the output pulses from the C.D.M., the sum of the summation means representing the integral of a predetermined function of the voltage and the magnetic flux applied to the C.D.M. with respect to time.

Preferably the predetermined function is proportional to the product of the voltage and the magnetic flux applied to the C.D.M.

In one particular embodiment the magnetic flux applied to the C.D.M. remains substantially constant, whereby the sum of the summation means represents the integral of the voltage applied to the C.D.M. with respect to time.

In another particular embodiment the voltage applied to the C.D.M. remains substantially constant, whereby the sum of the summation means represents the integral of the magnetic flux applied to the C.D.M. with respect to time.

In another particular embodiment for use with an electrical system wherein the voltage applied to the C.D.M. is representative of the system voltage and the magnetic flux applied to the C.D.M. is representative of the system current, the summation means is arranged to produce an output or outputs representative of at least one of the system quantities: active power, active energy, reactive power, reactive energy, apparent power, apparent energy, power factor, phase angle between the system voltage and the system current, and the sine of the phase angle.

Preferably the summation means comprises a counter arranged to be incremented by the output pulses of the C.D.M., the count of the counter being periodically sampled and reset.

An electrical measuring apparatus in accordance with the invention for use with a mains electrical system to measure various system quantities will now be described, by way of example only, with reference to the accompanying drawing which shows a block schematic diagram of the apparatus.

Referring now to the drawing, the apparatus includes a current domain magnetometer (C.D.M.) 1. To the C.D.M. 1 are applied a bias magnetic flux $B_B$ and a bias voltage $V_B$. A signal voltage $V_S$ and a signal magnetic flux $B_S$, representative of the (mains) voltage and the current respectively of the electrical system (not shown), are also applied to the C.D.M. 1. Although not shown, it will be appreciated that further biases are also applied to the C.D.M. 1 and the temperature of the device is stabilised or compensated for, so that the frequency of the output pulses from the C.D.M. 1 is proportional to $(B_B + B_S) \cdot (V_B + V_S)$.

The output pulses from the C.D.M. 1 are applied to a counter 2 which is incremented by each pulse. The counter 2 is repetitively sampled, fed to a subtractor 3 and reset after a period T. The period T, which may suitably be either the full or half period of the mains voltage, is determined by a clock 4 which is synchronised with the mains voltage via synchroniser 5, and which produces pulses dependent on the frequency of the mains voltage. The clock pulses are applied to a divider 6 which every n clock pulses (corresponding to the time T) causes the count of the counter 2 to be sampled and fed to the subtractor 3 and then causes the counter 2 to be reset.

To compensate for the bias applied to the C.D.M. 1, a signal equal to what the count of the counter 2 would be at the end of the period T if no magnetic flux or voltage signals were applied to the C.D.M. 1 (i.e. if $V_S$ and $B_S$ were both zero) is generated in bias compensator 7. The bias compensation signal is applied to another input of the subtractor 3. The subtractor 3 produces at its output a signal W representative of the difference between the count of the counter 2 at the end of a period T and the bias compensation signal, i.e. representative of the definite integral $\int_o^T B_S \cdot V_S \, dt$. It will be appreciated that since $B_S$ is representative of the system current, this integral is representative of the average active power being consumed through the system.

It will be appreciated that the average active power signal W is periodically up-dated at a frequency 1/T. In order to provide a measurement of the average active energy consumed through the system, the values of the average active power signal W for each period T are summed in an accumulator 8 to produce a signal Wh representative of the average active energy of the system.

The bias compensation signal from the bias compensator 7 is also applied to one input of a comparator 9. To the other input of the comparator 9 is applied the output of the C.D.M. 1. The comparator 9 produces at its output a gating pulse as long as the frequency of the output pulses from the C.D.M. 1 is less than it would be if no magnetic flux or voltage signals were applied to the C.D.M. 1. The gating pulse from the comparator 9 is applied to one input of an AND gate 10, to the other input of which are applied clock pulses from the clock 4. Thus the AND gate 10 passes clock pulses for as long as a gating pulse is produced by the comparator 9.

The clock pulses passed by the AND gate 10 are applied to a counter 11 which is incremented by each pulse. The counter 11 is periodically sampled to produce its output signal and reset at such a frequency that the number of pulses counted in each period (e.g. half a cycle of the mains voltage) is representative of the magnitude of the phase angle between the system voltage and the system current. Thus the output signal $\phi$ is representative of the phase angle of the system.

The phase angle signal $\phi$ is applied to sine and cosine converters 12 and 13 where it is converted into signals representative of sine $\phi$ and cos $\phi$ respectively. It will be appreciated that the output signal from the cosine converter 13 is representative of the power factor of the system.

The cos $\phi$ signal from converter 13 is applied to one input of a divider 14, to the other input of which is applied the average active power W signal from the subtractor 3. The divider 14 produces an output signal VA representative of the quotient average active power divided by cos $\phi$. The ouput signal VA from the divider 14 is thus representative of the average apparent power being consumed through the system.

It will be appreciated that the average apparent power signal VA is periodically up-dated. In order to provide a measurement of the average apparent energy consumed through the system, each value of the apparent power measurement signal VA is summed in an accumulator 15 to produce a signal VAh representative of average apparent energy of the system.

The sin $\phi$ signal from the converter 12 is applied to one input of a multiplier 16, to the other input of which is applied the average apparent power signal VA. The multiplier 16 produces an output signal $VA_R$ representative of the product of average apparent power and sin $\phi$. The output signal $VA_R$ is thus representative of the average reactive power being "consumed" by the system.

It will be appreciated that the average reactor power signal $VA_R$ is periodically up-dated. In order to provide a measurement of the average reactive energy "consumed" through the system, each value of the average reactive power measurement signal $VA_R$ is summed in an accumulator 17 to provide an output signal $VA_Rh$ representative of the average reactive energy of the system.

It will be appreciated that whilst in the particular measuring apparatus described above by way of example both input signals to the C.D.M. are variable, in other arrangements one of the input signals may be constant, so that the sum of the summation means represents the integral of the other input signal with respect to time.

We claim:

1. An electrical measuring apparatus for use with an alternating current electrical power supply system, comprising: a carrier domain magnetometer responsive to a voltage input representative of the system voltage and a magnetic flux input representative of the system current to produce a train of pulses whose frequency varies with the product of said inputs; first counter means responsive to the output of the magnetometer to produce an output count representative of the number of pulses in the magnetometer output during a preceding predetermined period; bias compensating means arranged to produce a count equal to the output count of the counter means when said voltage and magnetic flux inputs are zero; subtracting means for producing an output equal to the difference between the count of the compensating means and the output count of the counter means, and hence representative of the active power supplied by the system; comparator means responsive to the outputs of the magnetometer and the compensating means to produce an output when the frequency of the magnetometer output has a value below its value when said voltage and magnetic flux inputs are zero; an AND gate having a first input connected to the output of the comparator; a clock pulse generator connected to a second input of the AND gate; and second counter means responsive to the output of the AND gate to produce an output count representative of the number of clock pulses applied to the AND gate while the comparator produces an output, and hence representative of the phase angle between the system voltage and current.

2. An apparatus according to claim 1 further including converter means to which the output of the second counting means is applied, thereby to produce outputs respectively representative of the sine and cosine of the system phase angle.

3. An apparatus according to claim 2 further including divider means to which the cosine output of said converter means and the output of said subtracting means are applied, thereby to produce an output representative of the apparent power supplied by the system.

4. An apparatus according to claim 3 further including multiplier means to which the sine output of the converter means and the output of said divider means are applied, thereby to produce an output representative of the reactive power supplied by the system.

* * * * *